(12) United States Patent
Nekkanty et al.

(10) Patent No.: US 12,341,281 B2
(45) Date of Patent: Jun. 24, 2025

(54) MICRO SOCKET ELECTRICAL COUPLINGS FOR DIES

(71) Applicant: Intel Corporation, Santa Clara, CA (US)

(72) Inventors: Srikant Nekkanty, Chandler, AZ (US); Debendra Mallik, Chandler, AZ (US); Joe F. Walczyk, Tigard, OR (US); Saikumar Jayaraman, Hillsboro, OR (US); Feroz Mohammad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1033 days.

(21) Appl. No.: 17/132,921

(22) Filed: Dec. 23, 2020

(65) Prior Publication Data

US 2022/0200183 A1 Jun. 23, 2022

(51) Int. Cl.
*H01R 13/11* (2006.01)
*H01L 23/00* (2006.01)
*H01L 23/532* (2006.01)
*H01L 25/075* (2006.01)
*H01R 12/58* (2011.01)

(52) U.S. Cl.
CPC ........ *H01R 13/11* (2013.01); *H01L 23/53228* (2013.01); *H01L 24/14* (2013.01); *H01L 25/075* (2013.01); *H01R 12/58* (2013.01)

(58) Field of Classification Search
CPC ........ H01R 13/11; H01R 12/58; H01L 24/14; H01L 25/075; H01L 27/14634; H01L 23/53228
See application file for complete search history.

(56) References Cited

U.S. PATENT DOCUMENTS

| 5,802,699 | A | * | 9/1998 | Fjelstad | H05K 7/1084 |
| | | | | | 361/776 |
| 6,731,009 | B1 | * | 5/2004 | Jones | H01L 25/0657 |
| | | | | | 257/723 |
| 7,266,302 | B2 | * | 9/2007 | Bremner | H04B 10/2589 |
| | | | | | 398/139 |

(Continued)

FOREIGN PATENT DOCUMENTS

WO WO 2020216916 10/2020

OTHER PUBLICATIONS

Extended European Search Report for European Patent Application No. 21196513.2, mailed Mar. 3, 2022, 8 pgs.

(Continued)

*Primary Examiner* — Marcus E Harcum
(74) *Attorney, Agent, or Firm* — Schwabe, Williamson & Wyatt P.C.

(57) ABSTRACT

Embodiments described herein may be related to apparatuses, processes, and techniques related to micro socket arrays with fine pitch contacts to electrically couple dies, in particular photonics dies, within multichip photonics packages. In embodiments, micro socket arrays may be used in conjunction with multichip module packaging that include silicon photonic engines and optical fiber modules on the same package. In embodiments, these packages may also use a system on chip (SOC), as well as fine pitch die to die connections, for example an EMIB, that may be used to connect a PIC with an SOC. Other embodiments may be described and/or claimed.

18 Claims, 10 Drawing Sheets

(56) References Cited

U.S. PATENT DOCUMENTS

| | | | | |
|---|---|---|---|---|
| 8,926,196 B2* | 1/2015 | Detofsky | ............. | G02B 6/4204 |
| | | | | 385/88 |
| 9,028,157 B2* | 5/2015 | Na | ............................ | G02B 6/12 |
| | | | | 385/37 |
| 9,123,630 B2* | 9/2015 | Kim | ..................... | H01L 25/0652 |
| 9,130,080 B2* | 9/2015 | Hsiao | ................. | H01L 31/024 |
| 9,627,809 B2* | 4/2017 | Gordon | ................ | G02B 6/4284 |
| 9,832,876 B2* | 11/2017 | Prakash | .................. | H01L 23/00 |
| 9,935,088 B2* | 4/2018 | Budd | .................. | H01S 5/02325 |
| 11,054,597 B2* | 7/2021 | Raghunathan | .......... | G02B 6/428 |
| 2012/0217607 A1* | 8/2012 | Hanai | ................. | H01L 27/1469 |
| | | | | 438/66 |
| 2014/0061911 A1* | 3/2014 | Cooper | .................. | H01L 24/81 |
| | | | | 438/107 |
| 2014/0263955 A1* | 9/2014 | Dixon | ............... | H01L 27/14636 |
| | | | | 438/66 |
| 2014/0334601 A1* | 11/2014 | Shizukuishi | ......... | A61B 5/0062 |
| | | | | 378/62 |
| 2018/0045885 A1 | 2/2018 | Canali et al. | | |
| 2019/0137706 A1* | 5/2019 | Xie | ....................... | G02B 6/4202 |
| 2019/0243066 A1* | 8/2019 | Mahgerefteh | ......... | G02B 6/1223 |
| 2021/0202420 A1* | 7/2021 | MacDougal | ...... | H01L 27/14636 |
| 2022/0115354 A1* | 4/2022 | Bornfreund | ............. | H01L 24/05 |

OTHER PUBLICATIONS

Thacker H D et al: "Wafer-Testing of Optoelectonic-Gigascale CMOS Integrated Circuits", IEEE Journal of Selected Topics in Quantum Electronics, IEEE, USA, vol. 17, No. 3, May 1, 2011, 12 pgs.

Notice of Allowance from European Patent Application No. 21196513. 2, mailed May 8, 2024, 41 pgs.

* cited by examiner

MICRO SOCKET ELECTRICAL COUPLINGS FOR DIES

FIELD

Embodiments of the present disclosure generally relate to the field of semiconductor packaging, and in particular to electrically coupling a photonics die with another component.

BACKGROUND

Continued growth in virtual machines and cloud computing will continue to increase the demand for high-quality, serviceable, computing devices that include multichip packages (MCP).

DETAILED DESCRIPTION

Figure 1:
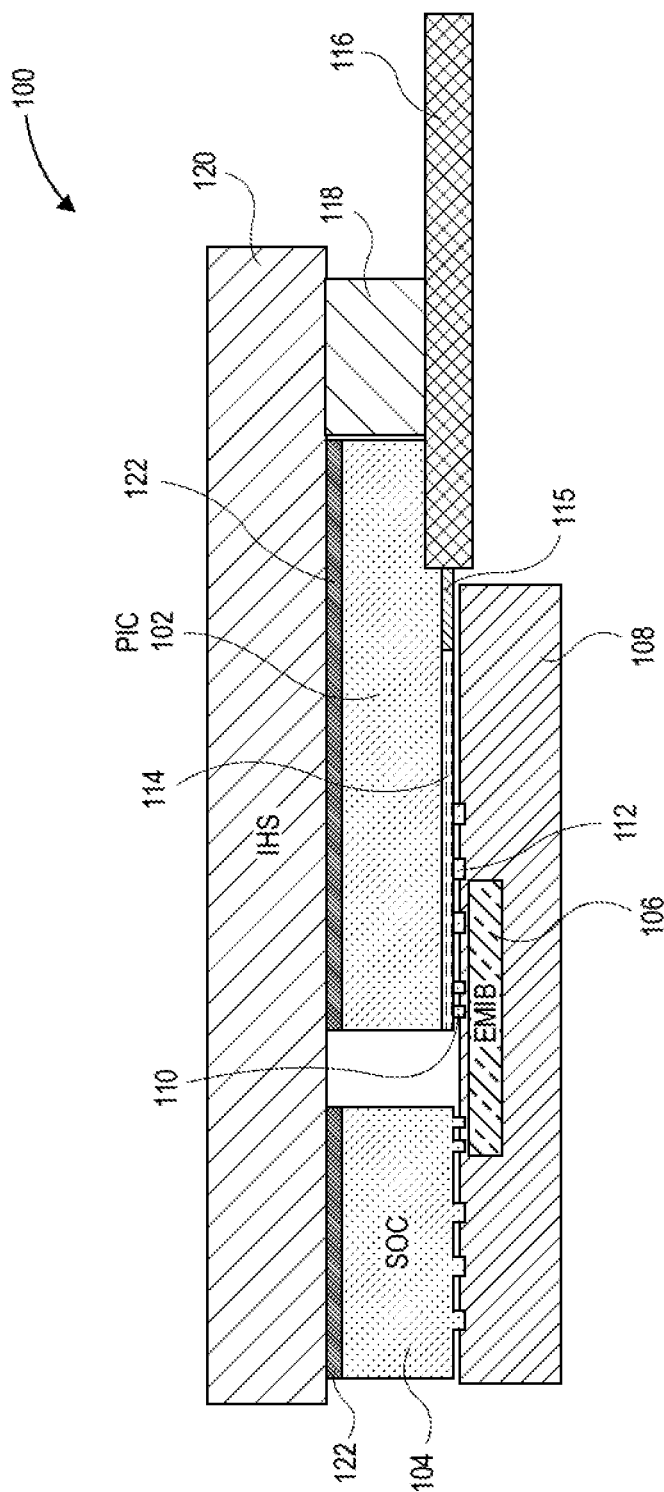
FIG. 1 illustrates a side view of an example legacy MCP with a photonics integrated circuit die (PIC) coupled with an embedded multi-die interconnect bridge (EMIB) and a substrate.

Embodiments described herein may be related to apparatuses, processes, systems, and techniques related to using micro socket arrays with fine pitch contacts to electrically couple dies, in particular PIC dies, within MCP photonics packages. In embodiments, micro socket arrays may be used in conjunction with multichip module packaging that include silicon photonic engines and optical fiber modules on the same package. In embodiments, these packages may also use a system on chip (SOC), as well as fine pitch die to die connections, for example an EMIB, that may be used to connect a PIC with an SOC.

In embodiments, the PIC may have a plurality of copper pillars that may be attached substantially orthogonally to a surface of the PIC, and maybe electrically coupled with photonic integrated circuitry within the PIC. In embodiments, the pitch of the copper pillars may be very fine, for example less than 200 micrometers (µm), that may electrically and physically couple with a micro socket array.

Legacy implementations for coupling PICs, or other dies, use permanent attach solutions, for example thermal compression bonding or hybrid bonding. These legacy approaches have some disadvantages. First, there is significant yield and cost impact. This may be due to current and future generation packages involving multiple numbers of modules to be integrated into a package. For example, if the yield associated with one module attached through a permanent connection is Y (less than 1), then the total yield of attaching N such modules is $Y^N$, which is very much less than Y.

Second, with legacy implementations, there is increased package assembly and testing complexity. With the growing complexity of modules, such as photonics engines with fine alignment optical fibers, the cost and complexity of package assembly may increase many times with the legacy approach of permanently bonding the module to the package. In implementations, significant process and material investments need to be made to ensure robust thermal-mechanical and reliable MCPs created with these legacy approaches. Also, in implementations, text complexity increases to ensure all modules, post attach process, meet quality assurance thresholds.

Embodiments described herein may use an architecture that uses a micro socket array with fine pitch contacts. This micro socket array can be assembled to an SOC package through existing assembly methods, such as thermal compression bonding to the main SOC package. Different modules, such as silicon based PICS with optical fibers, can then be assembled to the micro socket array to form the electrical connection between the module in the package. In embodiments, the PICS with optical fibers also have the flexibility to detach from the package by uncoupling and from the micro socket array. Thus, separable interface connections may be created between the module and the main SOC package.

Embodiments may increase MCP yield because individual PICS that fail quality thresholds after assembly may be removed and replaced using the micro socket array architecture. In this way, it is easier to replace a PIC module, and in particular easier to attach a "known good" PIC module. Embodiments also decouple complexity associated with the PIC die and warpage from die to die because fibers may attach on individual dies. For example, in legacy implementations, there will be warpage driven by coefficient of thermal expansion (CTE) difference between package substrate and PIC that needs to be accounted for during fiber assembly which makes it complex (impacts overall assembly yield). In embodiments, a micro socket architecture alleviates this complexity. In addition, embodiments may address field serviceability, with customers able to plug and unplug PIC, rather modules, that use a micro socket array architecture as needed.

In addition, embodiments may provide new options for package thermal architecture, for example a PIC that has a different heat spreader thermally coupled to it as opposed to SOC thermal architectures that include one heat spreader. For example, a PIC may have a separate heat spreader, such as a copper integrated heat spreader (IHS), a micro channel IHS, heat fins, or may even be a bare die. As a result, this may allow reduced thermal cross talk between components, and increase performance.

It should be appreciated that embodiments described herein may be discussed with respect to tonics MCP architectures, but may apply to other MCP architectures as well, including other devices such as high-bandwidth memory (HBM). Other embodiments may apply to using micro socket arrays to electrically and/or physically couple any two devices, such as a die to another die, a die to a substrate, or any two components In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a side view of an example legacy multichip package (MCP) with a photonics integrated circuit die (PIC) coupled with an embedded multi-die interconnect bridge (EMIB) and a substrate. Legacy package 100 may include a PIC 102, that is physically and electrically coupled to a substrate 108 and to an EMIB 106 that may be within the substrate 108. The EMIB 106 may be electrically coupled to a SOC 104, which may also be electrically and/or physically coupled with the substrate 108.

In legacy implementations, electrical routing 114 on the PIC 102 die may be coupled with electrical connectors 112 that electrically couple the PIC 102 die with the substrate 108. In other legacy implementations, the electrical connectors 112 may electrically couple with a redistribution layer (RDL) or organic routing on the substrate 108. In legacy implementations, fine pitched electrical connectors 110 may couple with the EMIB 106. In legacy implementations, the EMIB 106 may be electrically coupled with the SOC 104, or with other dies (not shown) that may be coupled with substrate 108.

PIC 102 may include one or more waveguides 115, and may also include V-grooves (not shown) to accept one or more optical fibers 116 to optically couple with the PIC 102. In legacy implementations, a support mechanism 118 may be physically coupled with the PIC 102, or physically coupled with an IHS 120. The support mechanism 118 may be used to provide support for the one or more optical fibers 116 that are optically coupled to the PIC 102. In embodiments, the IHS 120 may be thermally coupled with both the SOC 104 and the PIC 102. In embodiments a thermal interface material (TIM) 122 may be disposed between the SOC 104 and the IHS 120 facilitate thermal conductivity to draw heat away from the SOC 104 and the PIC 102.

Note that the physical and electrical coupling between the PIC 102 and the EMIB 106/substrate 108 is a permanent connection such as through reflow soldering, thermal compression bonding, and/or epoxy flow. To disassemble the PIC from the legacy package 100 includes removing the IHS 120 and decoupling the PIC 102 from the EMIB 106/substrate 108 which will likely damage the surfaces of the PIC 102, the EMIB 106, and the substrate 108.

Figure 2:
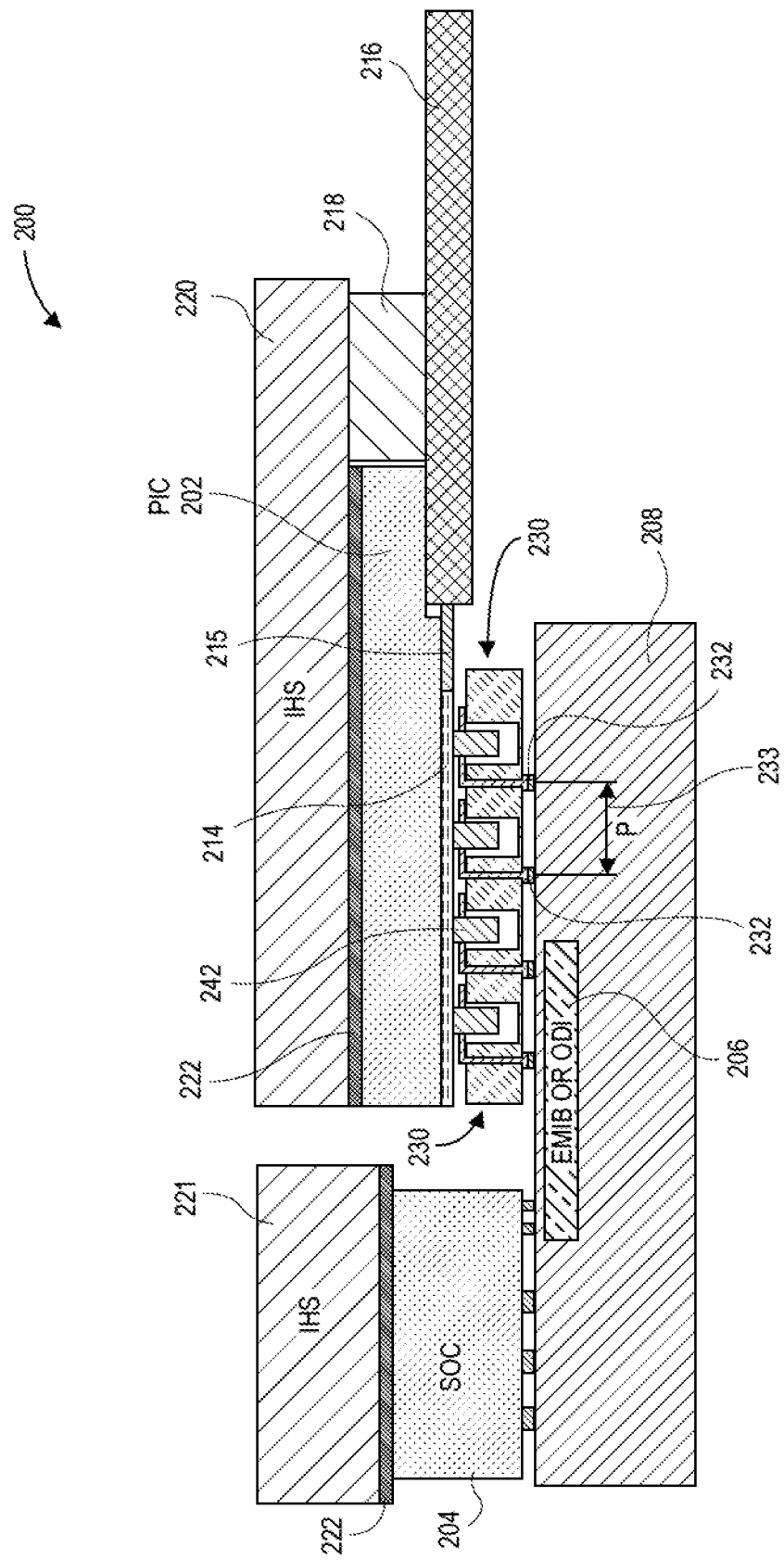
FIG. 2 illustrates a side view of a MCP that includes a PIC coupled with an EMIB and a substrate using copper pillars of the PIC inserted into a micro socket array, in accordance with various embodiments.

FIG. 2 illustrates a side view of a MCP that includes a PIC coupled with an EMIB and a substrate using copper pillars of the PIC inserted into a micro socket array, in accordance with various embodiments. Package 200 may be a MCP that includes a PIC 202 that is electrically coupled to substrate 208 and to EMIB 206. In embodiments, EMIB 206 may be an omni-directional interconnect (ODI). In embodiments, the EMIB 206 (or ODI) may be either passive or active. In embodiments, active bridges may have a PIC controller/PHY under the micro socket array to enable fast and narrow signaling and/or allow increased socket pitch to 100 μm to 200 micrometers. In embodiments, the EMIB 206 may be electrically coupled with the SOC 204. In embodiments, the PIC 202, substrate 208, SOC 204, and EMIB 206 may be similar to PIC 102, substrate 108, SOC 104, or EMIB 106 of FIG. 1.

In embodiments, electrical routing 214 of PIC 202 maybe electrically and physically coupled with an array of copper pillars 242. These copper pillars 242 may insert into a micro socket array 230. In embodiments, at least some of the micro sockets within micro socket array 230 have a pitch "P" 233 between electrodes 232. In embodiments, the pitch P may be 200 μm or less. In embodiments discussed below, the micro socket array 230 may be a two-dimensional array, with a pitch P between micro sockets in various directions at 200 μm or less. Thus, a pitch of the copper pillars 242 may also be 200 μm or less.

In embodiments, one or more optical fibers 216 may optically couple with the PIC 202 using a plurality of V-grooves (not shown), and may optically couple with the one or more optical fibers 216 using waveguide 215. In embodiments, support 218 may be coupled with a heat spreader 220 to provide physical support for the one or more optical fibers 216. Note that in package 200, the heat spreader 221 that is thermally coupled with the SOC 204, which may be thermally coupled using a TIM 222, is a different heat spreader that heat spreader 220 that is thermally coupled to the PIC 202, which may be thermally coupled using TIM 222. By using two distinct heat spreaders 221, 220, the PIC 202 may be removed from the micro socket array 230 for either cleaning, inspection, debugging or replacement.

Figure 3:
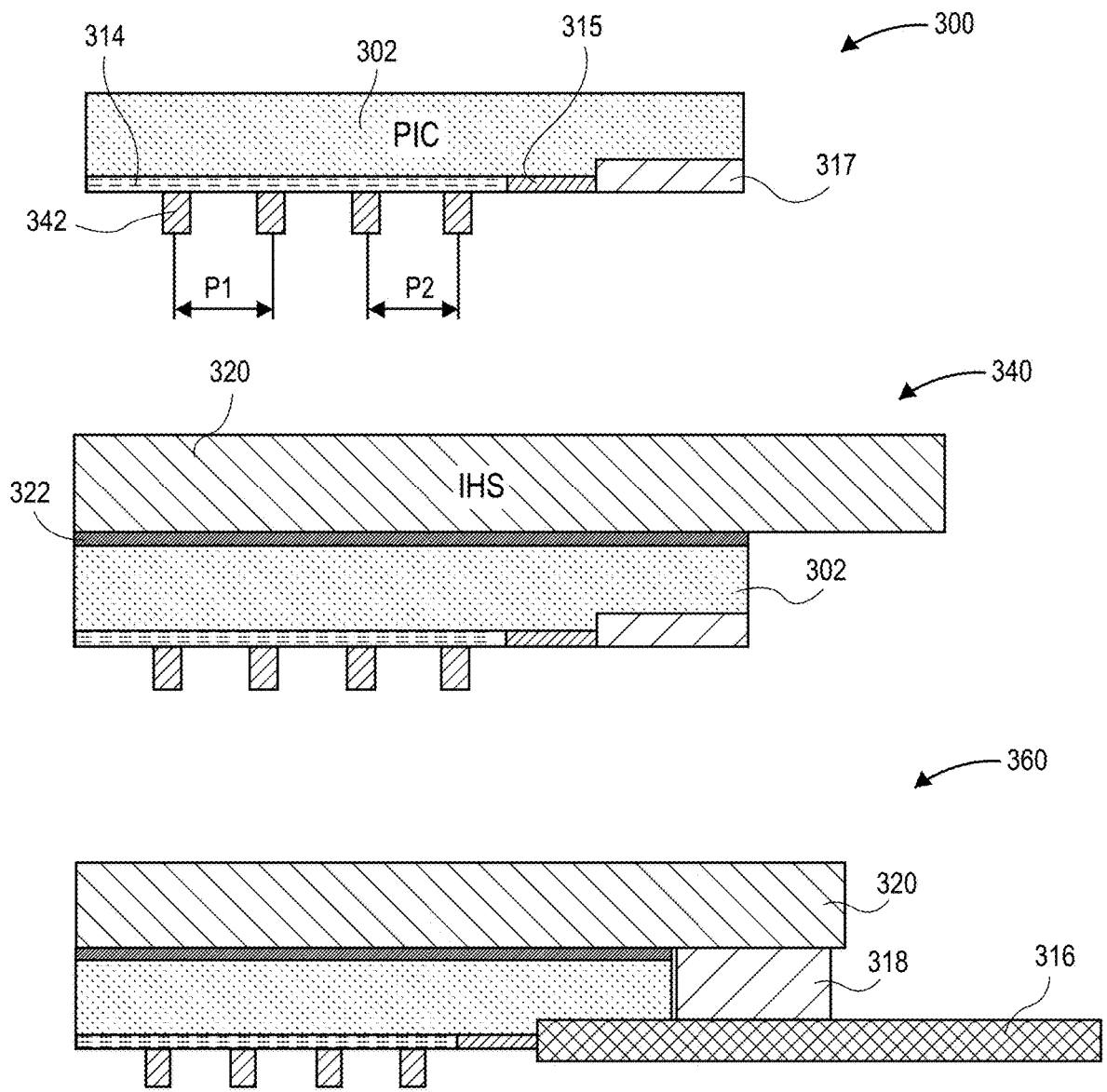
FIG. 3 shows various stages in a manufacturing process for a PIC to couple with a micro socket array, in accordance with various embodiments.

FIG. 3 shows various stages in a manufacturing process for a PIC to couple with a micro socket array, in accordance with various embodiments. Partial package 300 shows a PIC 302 optically coupled with a waveguide 315, which may be similar to PIC 202 and waveguide 215 of FIG. 2. In addition, the PIC 302 may include V-grooves 317, into which one or more optical fibers may be inserted. Copper pillars 342, which may be similar to copper pillars 242 of FIG. 2, may be formed on a lower side of the PIC 302, proximate to an electronic layer 314 on the PIC 302. In embodiments, the copper pillars 342 may include nickel/gold/palladium surface finish. In embodiments the copper pillars 342 may have a 50-100 μm pitch. In embodiments, the copper pillars 342 may be manufactured using wafer level plating. In embodiments, a first group of the copper pillars 342 has a pitch P1 different than a pitch P2 of a second group of the copper pillars 342.

Partial package 340 includes the partial package 330, with additional elements added. In embodiments, a TIM 322, which may be similar to TIM 222 of FIG. 2, may be applied to a top surface of the PIC 302. In embodiments, a heat spreader 320, which may be similar to heat spreader 220 of FIG. 2, may be applied and thermally coupled with the PIC 302 and/or the TIM 322. In embodiments, the heat spreader 320 may be made of copper, some other metal, or some other metal alloy. In embodiments, the design of the heat spreader 320 may include a microchannel, a heat fin, a vapor chamber or the like.

Figure 4:
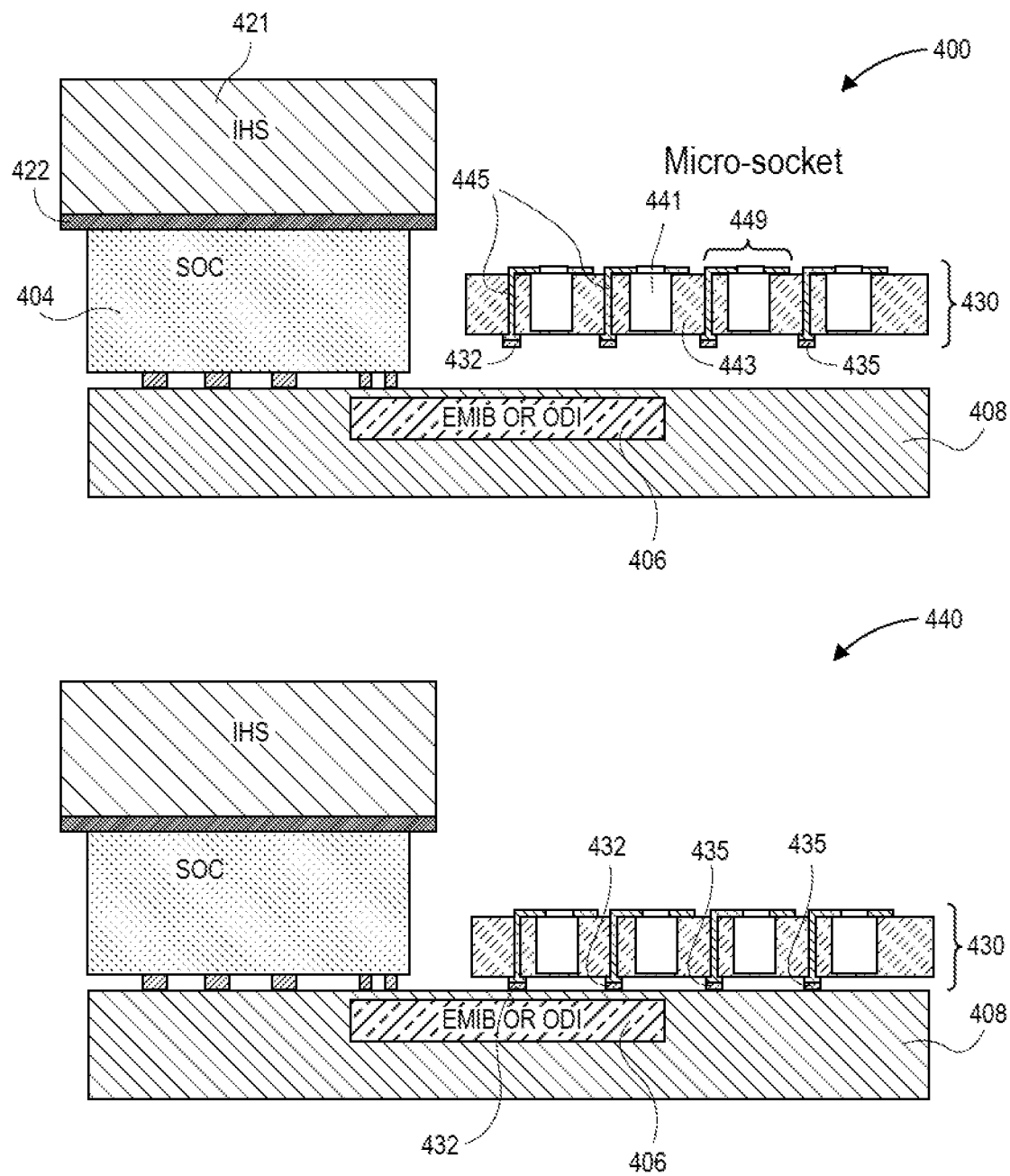
FIG. 4 shows various stages in a manufacturing process for a micro socket array to be coupled with an EMIB and a substrate, in accordance with various embodiments.

Partial package 360 may include the elements of partial package 340, with additional components added. In particular, a support 318 may be adhesively physically coupled, or coupled in some other way, to heat spreader 320. Support 318 may be similar to support 218 of FIG. 2, which may be used to provide physical support for one or more optical fibers 316 into the V-groove 317. In embodiments, other support mechanisms may be used such as epoxy, adhesive or the like FIG. 4 shows various stages in a manufacturing process for a micro socket array to be coupled with an EMIB and a substrate, in accordance with various embodiments. Partial package 400 may include substrate 408 that includes an EMIB 406 that may be electrically coupled to an SOC 404. The SOC 404 may be thermally coupled to a heat spreader 421, and may have a TIM 422 thermally coupling the heat spreader 421 and the SOC 404. The substrate 408, EMIB 406, SOC 404, heat spreader 421, and TIM 422 may be similar to the substrate 208, EMIB 206, SOC 204, heat spreader 221, and TIM 222 of FIG. 2.

Micro socket array 430, which may be similar to micro socket array 230 of FIG. 2, is shown as a separate component, ready to be physically and/or electrically coupled onto the substrate 408 and/or EMIB 406. Micro socket array 430 includes individual micro sockets 449 with openings 441 to receive a copper pin such as copper pin 342 of FIG. 3. In embodiments, electrical pin connectors 445 may come into physical and electrical contact with the copper pin after insertion. A connector, such as connector 432 is electrically coupled with an electrical pin connector 445 for electrical couplings that may be with the EMIB 406.

In embodiments, a different connector, such as connector 435 may electrically and/or physically couple with the substrate 408. In embodiments, the connectors 432, 435 may be associated with different groups of micro sockets 449 within micro socket array 430 that may have a different type of connector or may have a different pitch. In addition, there may be a number of different type of supports for the individual micro sockets 449 within the micro socket array 430. For example, a dielectric 443 may be used to provide structure, support electrical connections, and maintain pitch between the individual micro sockets 449.

Partial package 440 shows the micro socket array 430 physically and electrically coupled to the substrate 408 and to the EMIB 406. In embodiments, thermal compression bonding may be used to provide this coupling.

Figure 5:
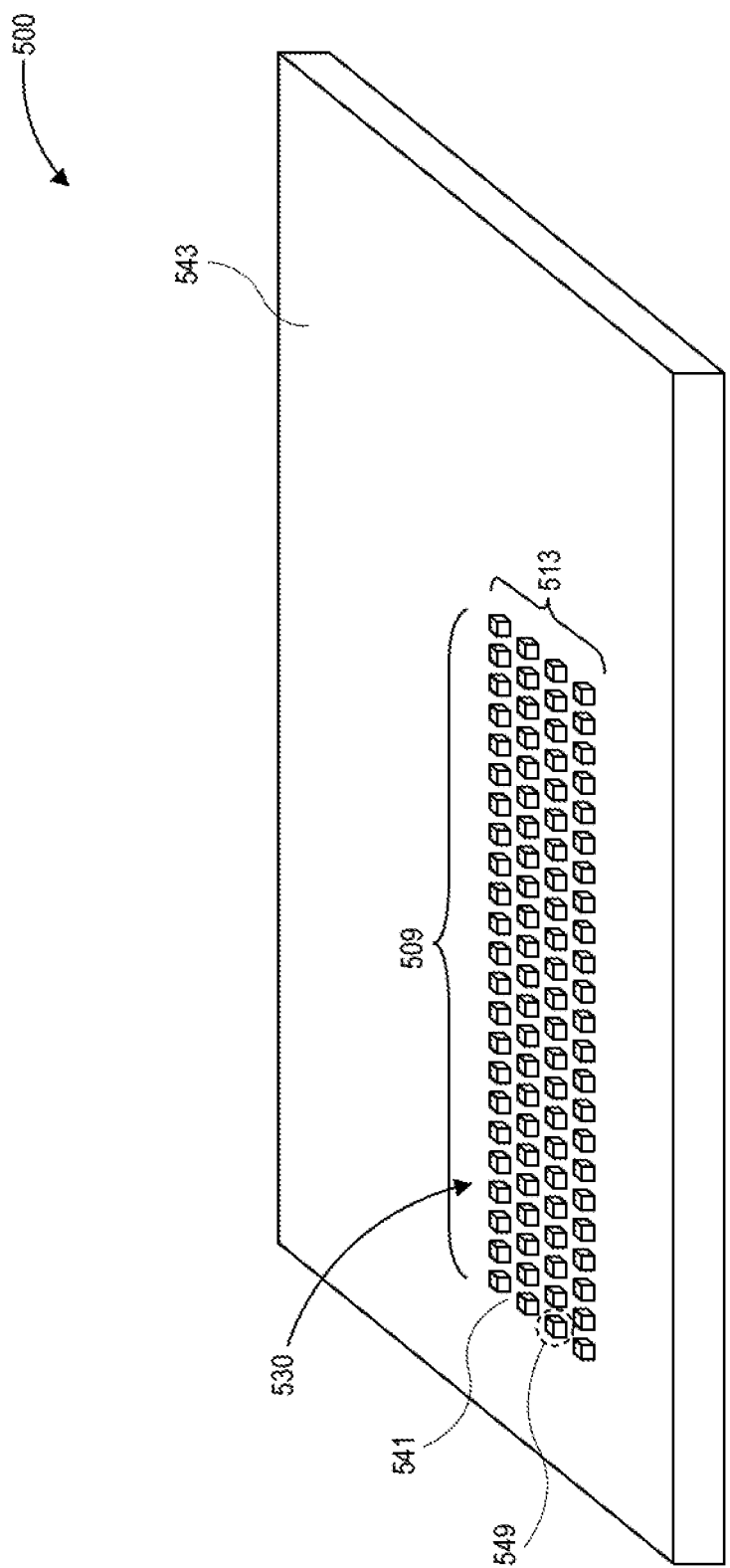
FIG. 5 shows a perspective view of a micro socket array on a substrate, in accordance with various embodiments.

FIG. 5 shows a perspective view of a micro socket array on a substrate, in accordance with various embodiments. Micro socket array 500 shows a perspective view of a plurality of micro sockets 549, each having an opening 541, that are arranged in rows 513 and columns 509, with each micro socket 549 supported in a dielectric 543. In embodiments, these may be similar to micro socket 449, opening 441, and dielectric 443 of FIG. 4. In embodiments, the dielectric 543 may be some other micro socket array 500 supporting mechanism. In embodiments, each pitch of the micro sockets 549 may be less than 200 μm.

Although the micro sockets 549 are shown in a grid array, in embodiments micro sockets 549 may form some other pattern. In other embodiments, the micro sockets 549 may be arranged in groups of micro sockets 549, each having a different pitch. In embodiments, there may be one group of micro sockets 549, and another group of wider-spaced sockets (not shown) that have a pitch greater than 200 μm. In this way, the micro socket array 500 may couple with different electrical features that may be on the substrate, such as EMIB 406 that has a micro pitch and a substrate 408 of FIG. 4 with connectors on the substrate having a larger pitch.

Figure 6:
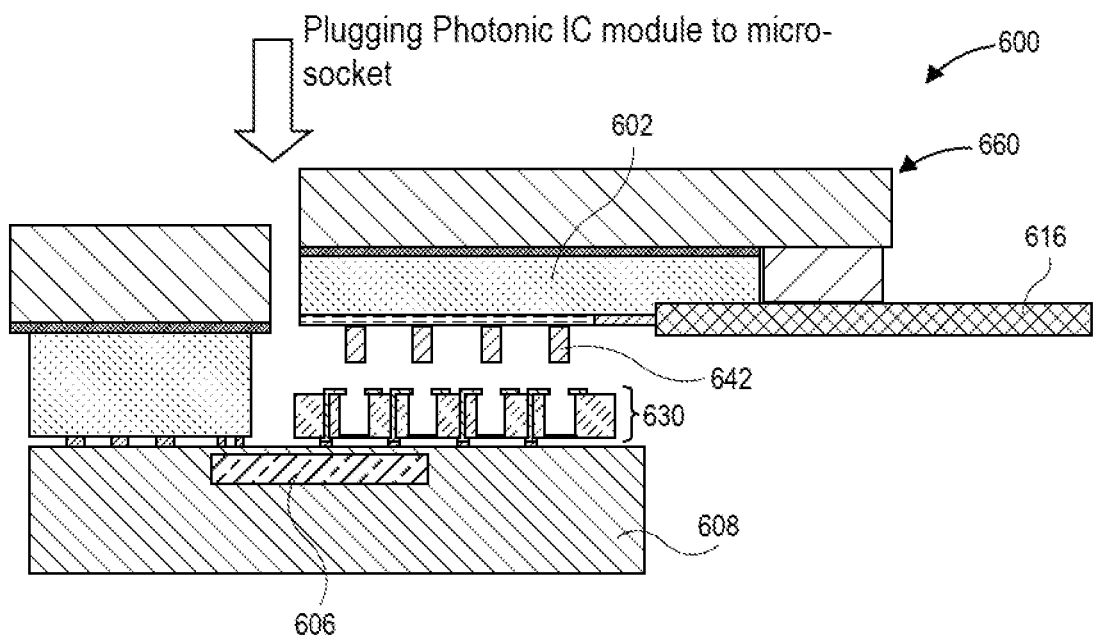
FIG. 6 shows various stages in coupling a PIC to a micro socket array, in accordance with various embodiments.
Figure 6:
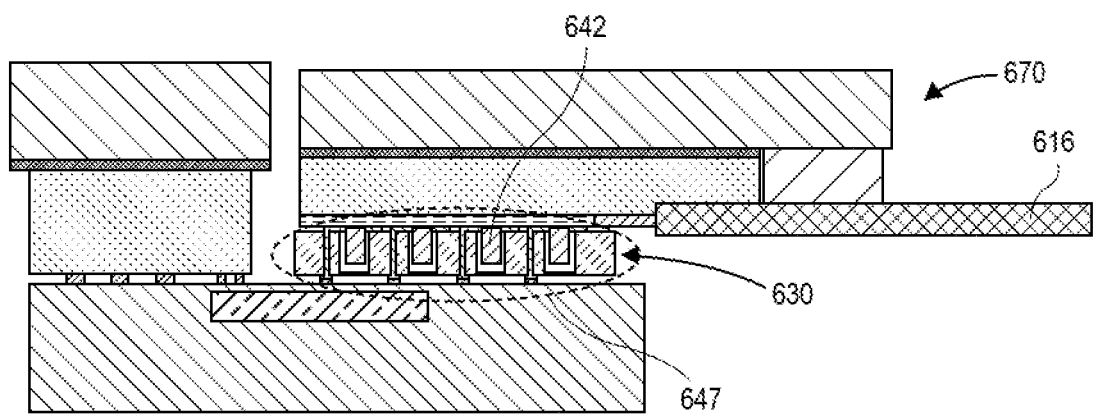

FIG. 6 shows various stages in coupling a PIC to a micro socket array, in accordance with various embodiments. Partial package 600 includes a photonics assembly 660, which may be similar to photonics assembly 360 of FIG. 3, prior to assembly. Photonics assembly 660 already has the one or more optical fibers 616 optically coupled with the PIC 602, which may be similar to one or more optical fibers 316 and PIC 302 of FIG. 3. As shown, the copper pillars 642, which may be similar to copper pillars 342 of FIG. 3, are ready to be inserted into micro socket array 630, which may be similar to micro socket array 230 of FIG. 2. Partial package 670 shows the final assembly, with copper pillars 642 inserted into the micro socket array 630 to form an electrical and physical coupling region 647.

Figure 7:
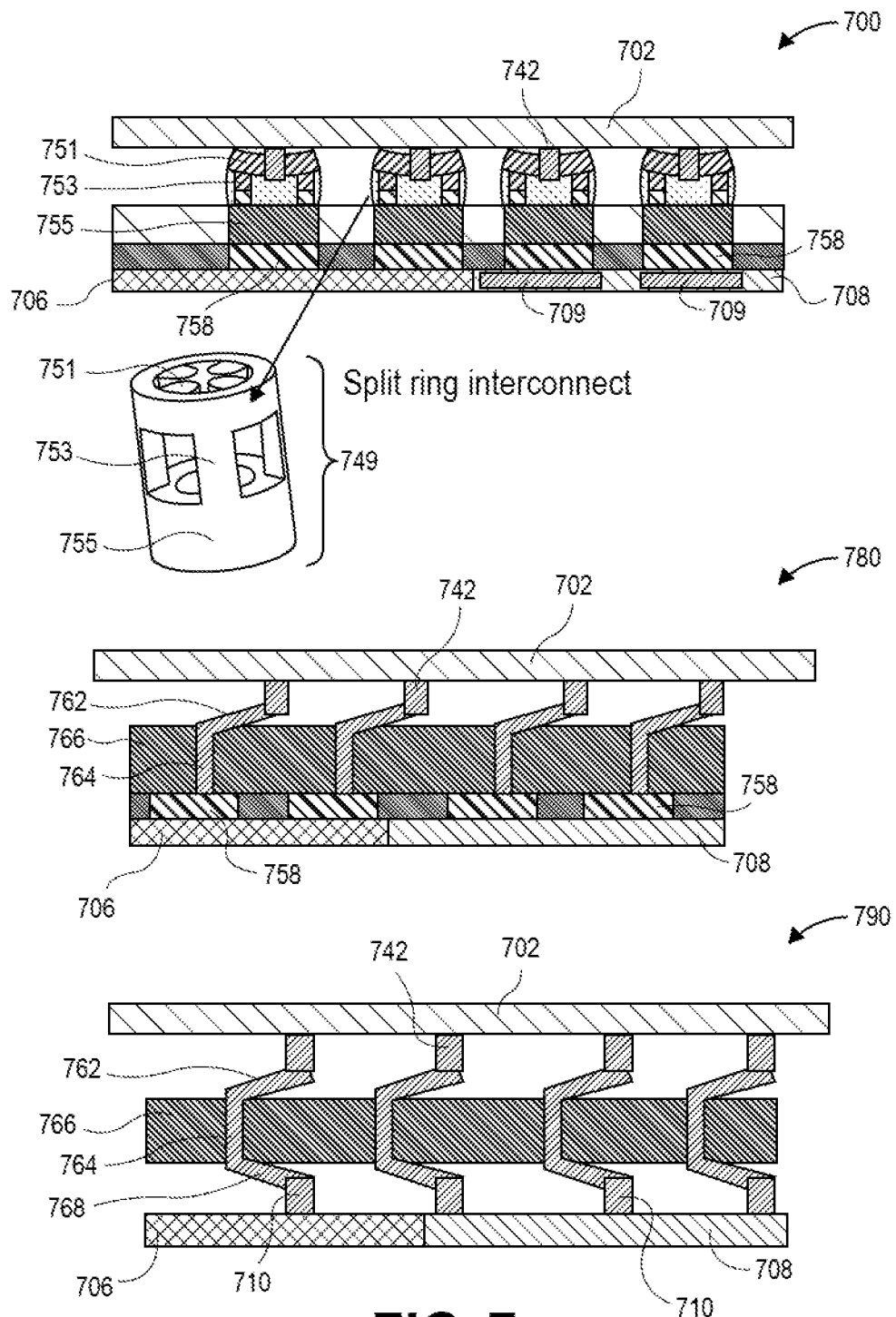
FIG. 7 shows various examples of micro sockets and how they couple with copper pillars, in accordance with the various embodiments.

FIG. 7 shows various examples of micro sockets and how they couple with copper pillars, in accordance with the various embodiments. Coupling region 700, which may be similar to coupling region 647 of FIG. 6, shows an implementation of a split ring interconnect. The socket 749, which may be similar to socket 449 of FIG. 4, includes top electrical connectors 751 into which copper pillars 742 coupled with PIC 702 are inserted. In embodiments, the multiple electrical connectors 751 may bend to allow the copper pillars 742 to enter the socket 749, and then provide a physical resistance if there is an attempt to extract the copper pillars 742 from the socket 749 by increasing force against the side of the copper pillars 742.

In embodiments, there may be an electrical connection 753 between the top electrical connectors 751 and the base 755 of the socket 749. In embodiments, there may be a solder connection 758, or some other electrical and/or physical coupling, that may electrically and physically couple with an EMIB 706. Other micro sockets may have a similar structure, but couple with electrical pad 709 that may be part of the substrate 708. In embodiments, the electrical pad 709 may be part of an RDL layer or organic routing at the surface of substrate 708.

Coupling region 780, which may be similar to coupling region 647 of FIG. 6, shows another example of a socket mechanism with a dielectric layer 766, which may be similar to dielectric layer 443 of FIG. 4, that provides physical support for a main electrical connector 764 within the dielectric layer 766. The main electrical connector 764 may be coupled with a top electrical connector 762, that in embodiments may be unibody with main electrical connector 764. The copper pillars 742, when seated, may come into physical and electrical contact with top electrical connector 762.

In embodiments, the top electrical connector 762 may bend to increase the quality of the physical and electrical contact with the copper pillars 742. In embodiments, the main electrical connector 764 may be electrically coupled with a solder region 758. In embodiments, the solder region 758 may be some other conductive alloy or metal. In embodiments, solder region 758 may electrically couple with an EMIB 706, which may be similar to EMIB 606 of FIG. 6. In other embodiments, solder region 758 may come in contact with the substrate 708, which may be similar to substrate 608 of FIG. 6. In embodiments, the electrical contact may be with an RDL (not shown) or with organic routing (not shown) on the surface of the substrate 708.

Coupling region 790, which may be similar to coupling region 647 of FIG. 6, shows another example of a socket mechanism with a dielectric layer 766, which may be similar to dielectric layer 443 of FIG. 4, that provides physical support for a main electrical connector 764 within the dielectric layer 766. In embodiments, the main electrical connector 764 may be electrically and physically coupled with a top electrical connector 762 and a bottom electrical connector 768.

In embodiments, the top electrical connector 762, bottom electrical connector 768, and main electrical connector 764 may be a unibody structure. Within coupling region 790, the bottom electrical connector 768 may couple with a copper pillars 710 that may be physically and electrically couple with an EMIB 706. In embodiments, the bottom electrical coupler 768 may flex as it comes into contact with the copper pillars 710 as the PIC 702 applies force to the top electrical connector 762. Note that in embodiments, copper pillars 710 may also be electrically and/or physically coupled to the substrate 708. In embodiments, the copper pillars 710 may be coupled with an RDL (not shown) or organic routing (not shown) on the surface of the substrate 708.

Figure 8:
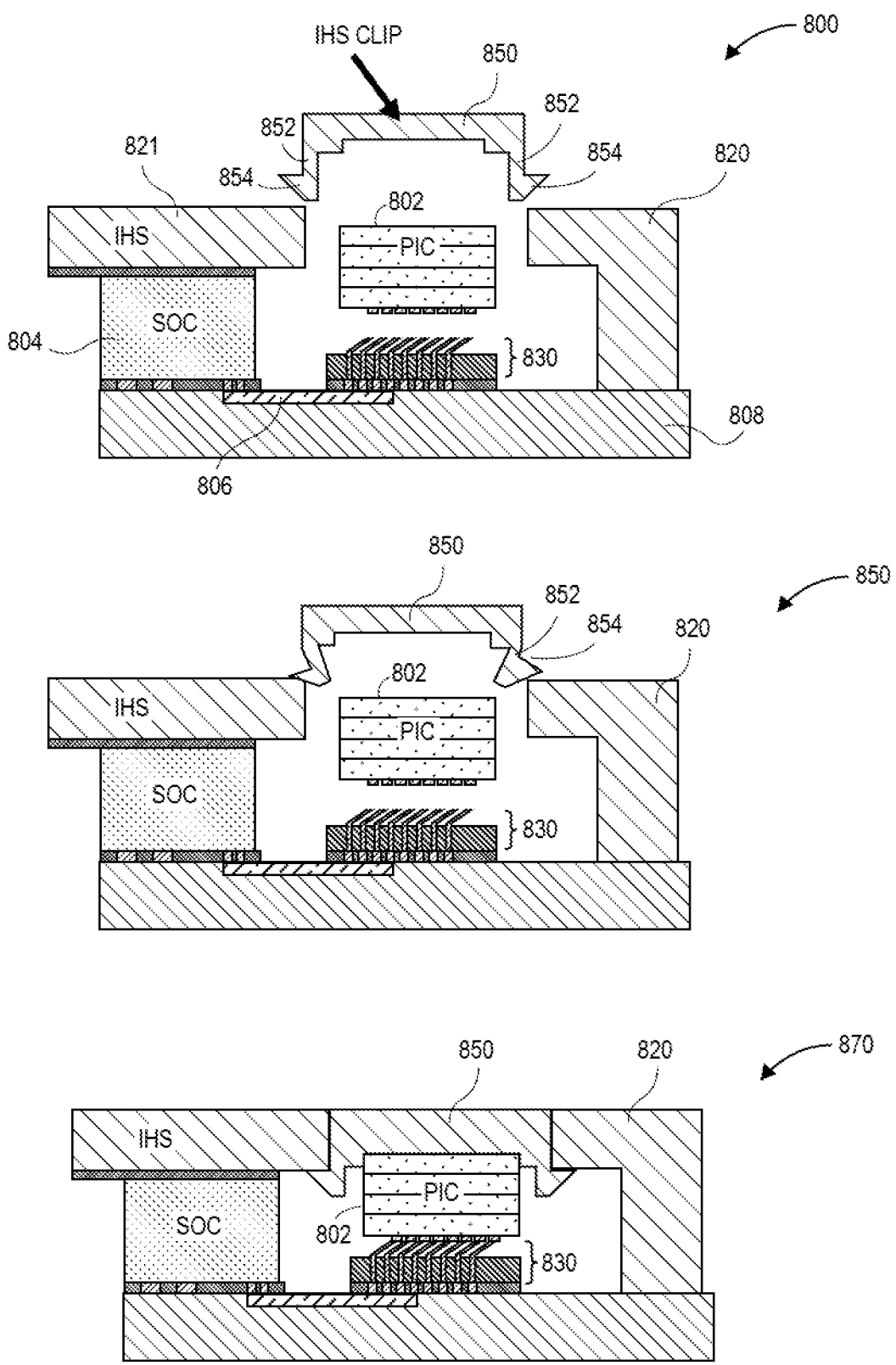
FIG. 8 shows an example of an integrated heat spreader (IHS) clip to provide physical and/or thermal coupling to a PIC, in accordance with various embodiments.

FIG. 8 shows an example of an integrated heat spreader (IHS) clip to provide physical and/or thermal coupling to a PIC, in accordance with various embodiments. Partial package 800, which may be similar to package 200 of FIG. 2, includes a PIC 802 that is about to be electrically and physically coupled with a micro socket array 830. In embodiments, PIC 802 and micro socket array 830 may be similar to PIC 202 and micro socket array 230 of FIG. 2. In addition, micro socket array 830 may be electrically and physically coupled with substrate 808, EMIB 806, and SOC 804, which may be similar to substrate 208, EMIB 206, and SOC 204 of FIG. 2.

In embodiments, heat spreader 821, which may be similar to heat spreader 221 of FIG. 2, may be thermally coupled with the SOC 804. In embodiments, heat spreader 820, which may be similar to heat spreader 220 of FIG. 2, may be thermally coupled with the substrate 808. As shown with respect to FIG. 2, heat spreader 221 is not physically or thermally coupled with heat spreader 220. In embodiments shown with respect to partial package 800, a heat spreader clip 850 may be inserted between heat spreader 821 and heat spreader 820. In embodiments, not only would heat spreader clip 850 thermally couple heat spreader 820 and 821, but heat spreader clip 850 may also serve to provide a downward force on the PIC 802 to physically and electrically couple the PIC 802 with the micro socket array 830.

As shown in partial package 850, portions of the heat spreader 850 may be bent at locations 852 to allow movement in toggle portion 854 to allow the locations 852 and the toggle portion 854 to enter an internal region of the partial package 850. As shown with respect to package 870, the heat spreader clip 850 is completely inserted into the package, providing a continual heat spreader as well as to provide a downward force on the PIC 802 to secure it to the micro socket array 830. In other embodiments, different designs may be used to insert the heat clip 850 into the package 870 and have it retained therein. Some embodiments may include a spring (not shown) or other mechanism to provide thermal contact and sustained physical pressure on the PIC 802. In embodiments, the heat spreader clip 850 may have mechanisms that allow its removal as well as secure the heat spreader clip 850 into position.

Figure 9:
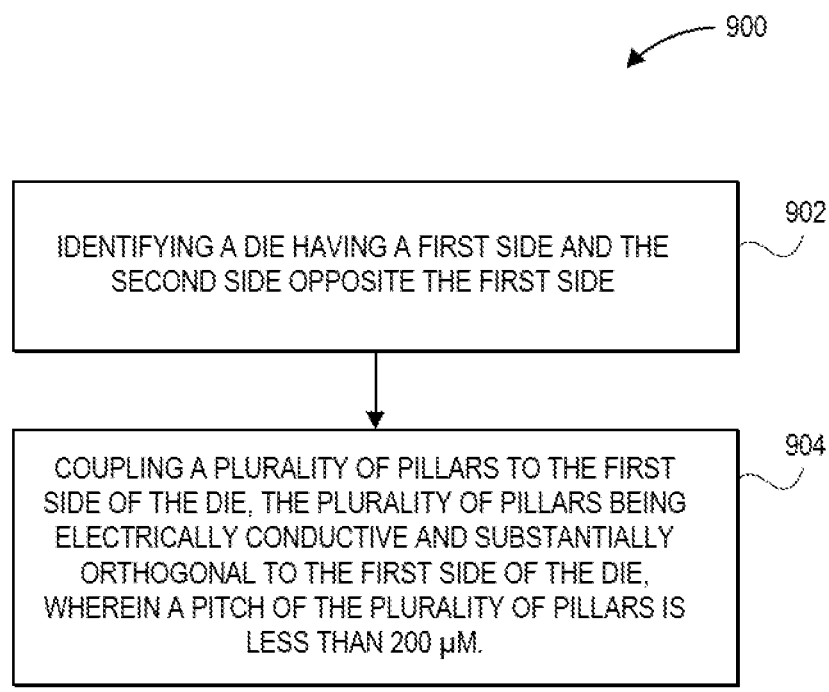
FIG. 9 illustrates an example process for adding copper pillars to a PIC, in accordance with various embodiments.

FIG. 9 illustrates an example process for adding copper pillars to a PIC, in accordance with various embodiments. Process 900 may be implemented by techniques, processes, apparatus, or systems as described or related to embodiments described herein, and particularly with respect to FIGS. 1-8.

At block 902, the process may include identifying a die having a first side and the second side opposite the first side. In embodiments the die may at least be PIC 202 of FIG. 2, 302 of FIG. 3, 602 of FIG. 6, 702 of FIG. 7, or 802 of FIG. 8. In embodiments, the second side of the die may be thermally coupled to a heat sink that may at least include heatsink 220 of FIG. 2, 320 of FIG. 3, 620 of FIG. 6, or 850 of FIG. 8.

At block 904, the process may further include coupling a plurality of pillars to the first side of the die, the plurality of pillars being electrically conductive and substantially orthogonal to the first side of the die, wherein a pitch of the plurality of pillars is less than 200 µm. In embodiments, the pillars may at least be pillars 242 of FIG. 2, 342 of FIG. 3, 642 of FIG. 6, or 742 of FIG. 7

Figure 10:
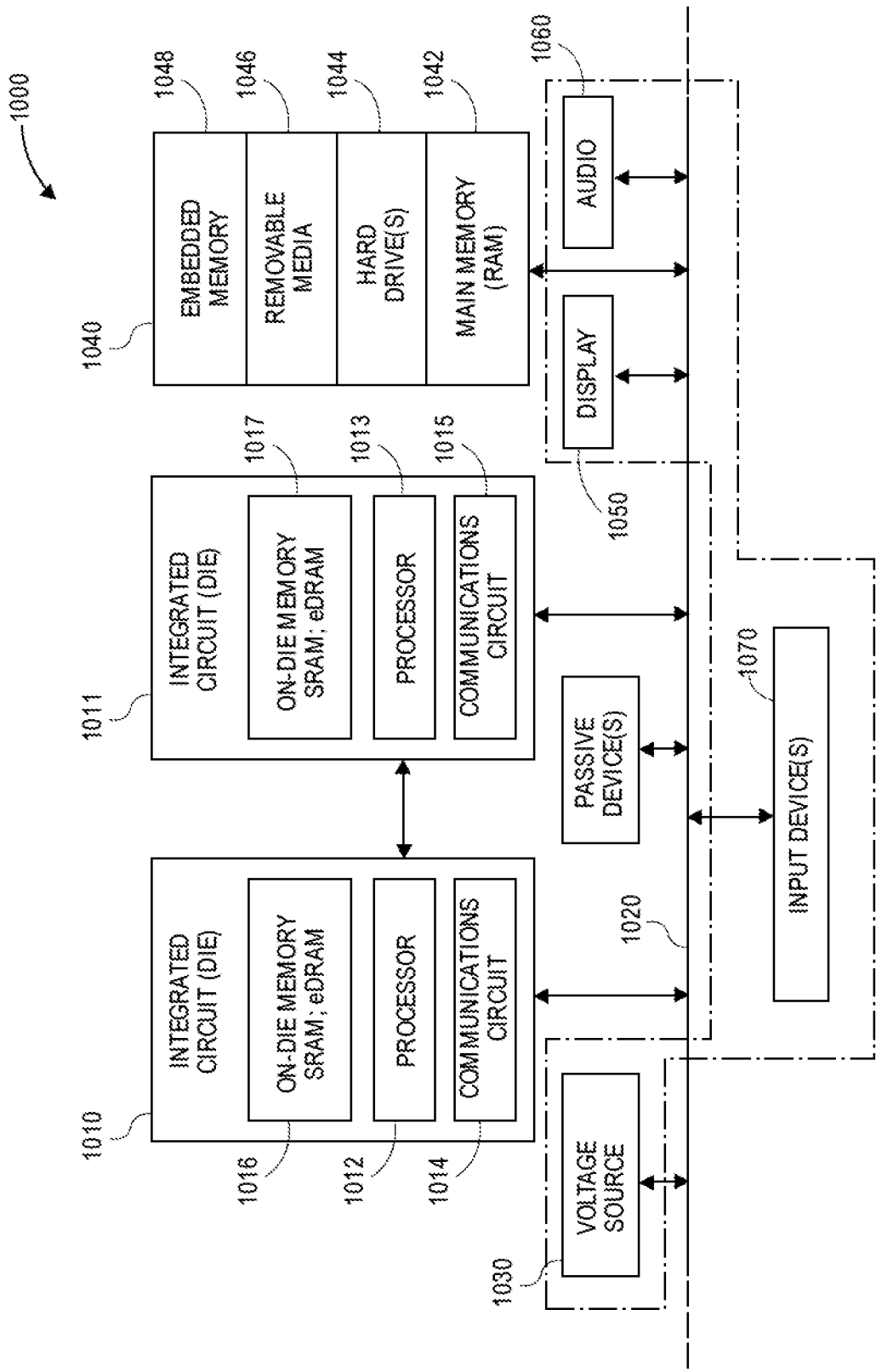
FIG. 10 schematically illustrates a computing device, in accordance with embodiments.

FIG. 10 schematically illustrates a computing device, in accordance with embodiments. The computer system 1000 (also referred to as the electronic system 1000) as depicted can embody all or part of micro socket electrical couplings for dies, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, all or part of an optical multichip package with multiple SOC dies, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including all or part of micro socket electrical couplings for dies, according to any of the several disclosed embodiments and their equivalents, an electronic system, a computer system, one or more methods of fabricating an integrated circuit, and one or more methods of fabricating an electronic assembly that includes a package substrate implementing all or part of micro socket electrical couplings for dies, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed processes used for micro socket electrical couplings for dies and their equivalents. A foundation substrate may be included, as represented by the dashed line of FIG. 10. Passive devices may also be included, as is also depicted in FIG. 10.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

Examples

Example 1 is an apparatus comprising: a die with a first side and a second side opposite the first side; a plurality of pillars that are electrically conductive and disposed on the first side of the die, each of the plurality of pillars orthogonal to the first side of the die; and wherein a pitch of the plurality of pillars is less than 200 micrometers ($\mu m$).

Example 2 may include the apparatus of example 1, wherein the plurality of pillars include a selected one of: copper, copper alloy, or liquid metal.

Example 3 may include the apparatus of example 2, wherein the plurality of copper pillars are disposed on the first side of the die using a lithography process.

Example 4 may include the apparatus of example 1, wherein the die includes photonics circuitry; and wherein the electrically conductive pillars are electrically coupled with the photonics circuitry.

Example 5 may include the apparatus of example 1, wherein the plurality of pillars form an array of pillars to electrically or physically couple into a micro-socket array.

Example 6 may include the apparatus of example 1, wherein the plurality of pillars form a first group of pillars and a second group of pillars, wherein a pitch of the first group of pillars is different than a pitch of the second group of pillars.

Example 7 may include the apparatus of example 1, further including an alignment feature coupled with the surface of the die to align the die during electrical coupling to another component.

Example 8 may include the apparatus of any one of examples 1-7, wherein the pillars have a length that extends beyond the first side of the die that ranges from 200 to 500 µm.

Example 9 is a socket apparatus comprising: a plurality of structures having a first side and a second side opposite the first side; a plurality of openings in the first side, respectively, of the plurality of structures to receive a plurality of conductive pillars; a first plurality of conductors respectively, within the plurality of structures to come into electrical contact with the plurality of conductive pillars when inserted into the first side of the plurality of structures; a second plurality of conductors, respectively, at the second side of the plurality of structures, the first plurality of conductors electrically coupled, respectively, with the second plurality of conductors; and wherein a pitch of the plurality of openings in the first side is less than 200 µm.

Example 10 may include the apparatus of example 9, wherein the second side of the plurality of structures are physically coupled with a first side of a dielectric layer having the first side and a second side opposite the first side.

Example 11 may include the apparatus of example 10, further including electrical connections on the second side of the dielectric layer that are electrically coupled, respectively, with the second plurality of conductors at the second side of the plurality of structures.

Example 12 may include the apparatus of example 11, wherein the second side of the dielectric layer is electrically or physically coupled with a selected one or more of: an embedded multi-die interconnect bridge (EMIB), a silicon interposer, organic routing on a substrate, a redistribution layer (RDL) on the substrate, or another die.

Example 13 may include the apparatus of example 9, wherein the plurality of structures form a first group of structures at a second group of structures, wherein a pitch of the plurality of openings in the first side of the first group of structures is different than a pitch of the plurality of openings in the first side of the second group of structures.

Example 14 may include the apparatus of example 13, wherein the first group of structures is to be electrically coupled with an EMIB and the second group of structures is to be electrically coupled with a substrate.

Example 15 is a method comprising: identifying a die having a first side and the second side opposite the first side; coupling a plurality of pillars to the first side of the die, the plurality of pillars being electrically conductive and substantially orthogonal to the first side of the die; and wherein a pitch of the plurality of pillars is less than 200 µm.

Example 16 may include the method of example 15, wherein the plurality of pillars are copper pillars.

Example 17 may include the method of any one of examples 15-16, wherein the plurality of pillars have a length that extends beyond the first side of the die that ranges from 200 to 500 µm.

Example 18 is a system, comprising: a die, including: a first side and a second side opposite the first side; a plurality of copper pillars disposed on the first side of the die, each of the plurality of pillars orthogonal to the first side of the die; and wherein a pitch of the plurality of copper pillars is less than 200 micrometers (µm); a socket coupled with the die, the socket, including: a plurality of structures having a first side and a second side opposite the first side; a plurality of openings in the first side, respectively, of the plurality of structures to receive a plurality of copper pillars; a first plurality of conductors respectively, within the plurality of structures to come into electrical contact with the plurality of copper pillars when inserted into the first side of the plurality of structures; a second plurality of conductors, respectively, at the second side of the plurality of structures, the first plurality of conductors electrically coupled, respectively, with the second plurality of conductors; and wherein a pitch of the plurality of openings in the first side is less than 200 µm; wherein the socket is electrically coupled with the die by inserting the plurality of copper pillars, respectively, into the plurality of openings of the plurality of structures.

Example 19 may include the system of example 18, wherein the second side of the plurality of structures are physically coupled with a first side of a dielectric layer having the first side and a second side opposite the first side; and further including electrical connections on the second side of the dielectric layer that are electrically coupled, respectively, with the second plurality of conductors at the second side of the plurality of structures.

Example 20 may include the system of any one of examples 18-19, wherein the second side of the dielectric layer is electrically or physically coupled with a selected one or more of: an embedded multi-die interconnect bridge (EMIB), a silicon interposer, organic routing on a substrate, a redistribution layer (RDL) on the substrate, or another die.

What is claimed is:
1. An apparatus comprising:
a die with a first side and a second side opposite the first side;
a plurality of pillars that are electrically conductive and disposed on the first side of the die, each of the plurality of pillars orthogonal to the first side of the die, wherein the plurality of pillars includes a first group of pillars and a second group of pillars, wherein a pitch of the first group of pillars is different than a pitch of the second group of pillars; and
wherein the first group of pillars is to be received by first openings of a socket and the second group of pillars is to be received by second openings of the socket, the first openings having a pitch different than a pitch of the second openings.

2. The apparatus of claim 1, wherein the plurality of pillars include a selected one of: copper, copper alloy, or liquid metal.

3. The apparatus of claim 2, wherein the plurality of copper pillars are disposed on the first side of the die using a lithography process.

4. The apparatus of claim 1, wherein the die includes photonics circuitry; and wherein the electrically conductive pillars are electrically coupled with the photonics circuitry.

5. The apparatus of claim 1, wherein the plurality of pillars form an array of pillars to electrically or physically couple into a micro-socket array.

6. The apparatus of claim 1, further including an alignment feature coupled with the surface of the die to align the die during electrical coupling to another component.

7. The apparatus of claim 1, wherein the pillars have a length that extends beyond the first side of the die that ranges from 200 to 500 µm.

8. A socket apparatus comprising:
a plurality of structures having a first side and a second side opposite the first side, wherein the plurality of structures form a first group of structures and a second group of structures;
a plurality of openings in the first side, respectively, of the plurality of structures to receive a plurality of conductive pillars, wherein a pitch of the plurality of openings in the first side of the first group of structures is different than a pitch of the plurality of openings in the first side of the second group of structures;
a first plurality of conductors respectively, within the plurality of structures to come into electrical contact with the plurality of conductive pillars when inserted into the first side of the plurality of structures;
a second plurality of conductors, respectively, at the second side of the plurality of structures, the first plurality of conductors electrically coupled, respectively, with the second plurality of conductors.

9. The apparatus of claim 8, wherein the second side of the plurality of structures are physically coupled with a first side of a dielectric layer having the first side and a second side opposite the first side.

10. The apparatus of claim 9, further including electrical connections on the second side of the dielectric layer that are electrically coupled, respectively, with the second plurality of conductors at the second side of the plurality of structures.

11. The apparatus of claim 10, wherein the second side of the dielectric layer is electrically or physically coupled with a selected one or more of: an embedded multi-die interconnect bridge (EMIB), a silicon interposer, organic routing on a substrate, a redistribution layer (RDL) on the substrate, or another die.

12. The apparatus of claim 8, wherein the first group of structures is to be electrically coupled with an EMIB and the second group of structures is to be electrically coupled with a substrate.

13. A method comprising:
identifying a die having a first side and the second side opposite the first side;
coupling a plurality of pillars to the first side of the die, the plurality of pillars being electrically conductive and substantially orthogonal to the first side of the die, wherein the plurality of pillars includes a first group of pillars and a second group of pillars, wherein a pitch of the first group of pillars is different than a pitch of the second group of pillars; and
inserting the first group of pillars into first openings of a socket and the second group of pillars into second openings of the socket, the first openings having a pitch different than a pitch of the second openings.

14. The method of claim 13, wherein the plurality of pillars are copper pillars.

15. The method of claim 13, wherein the plurality of pillars have a length that extends beyond the first side of the die that ranges from 200 to 500 µm.

16. A system, comprising:
a die, including:
a first side and a second side opposite the first side;
a plurality of copper pillars disposed on the first side of the die, each of the plurality of pillars orthogonal to the first side of the die; and
wherein a pitch of the plurality of copper pillars is less than 200 micrometers (µm);
a socket coupled with the die, the socket, including:
a plurality of structures having a first side and a second side opposite the first side, wherein the plurality of structures form a first group of structures and a second group of structures;
a plurality of openings in the first side, respectively, of the plurality of structures to receive a plurality of copper pillars, wherein a pitch of the plurality of openings in the first side of the first group of structures is different than a pitch of the plurality of openings in the first side of the second group of structures;
a first plurality of conductors respectively, within the plurality of structures to come into electrical contact with the plurality of copper pillars when inserted into the first side of the plurality of structures;
a second plurality of conductors, respectively, at the second side of the plurality of structures, the first plurality of conductors electrically coupled, respectively, with the second plurality of conductors; and
wherein the socket is electrically coupled with the die by inserting the plurality of copper pillars, respectively, into the plurality of openings of the plurality of structures.

17. The system of claim 16, wherein the second side of the plurality of structures are physically coupled with a first side of a dielectric layer having the first side and a second side opposite the first side; and
further including electrical connections on the second side of the dielectric layer that are electrically coupled, respectively, with the second plurality of conductors at the second side of the plurality of structures.

18. The system of claim 17, wherein the second side of the dielectric layer is electrically or physically coupled with a selected one or more of: an embedded multi-die interconnect bridge (EMIB), a silicon interposer, organic routing on a substrate, a redistribution layer (RDL) on the substrate, or another die.

* * * * *